(12) United States Patent
Kim

(10) Patent No.: US 6,707,137 B2
(45) Date of Patent: Mar. 16, 2004

(54) SEMICONDUCTOR PACKAGE AND METHOD FOR FABRICATING THE SAME

(75) Inventor: Sang Hai Kim, Chungcheongbuk-do (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 0 days.

(21) Appl. No.: 10/271,772

(22) Filed: Oct. 17, 2002

(65) Prior Publication Data

US 2003/0030138 A1 Feb. 13, 2003

Related U.S. Application Data

(62) Division of application No. 09/723,246, filed on Nov. 28, 2000, now Pat. No. 6,486,005.

(30) Foreign Application Priority Data

Apr. 3, 2000 (KR) ........................................ 2000/17400

(51) Int. Cl.[7] .............................................. H01L 23/495
(52) U.S. Cl. ...................... 257/668; 257/680; 257/779; 257/780; 257/784; 257/737
(58) Field of Search ................................. 257/668, 680, 257/779–780, 784, 737

(56) References Cited

U.S. PATENT DOCUMENTS 5,849,608 A    12/1998   Abe
5,920,118 A     7/1999   Kong
6,087,200 A  *  7/2000   MacPherson ............... 438/106
6,181,569 B1    1/2001   Chakrovorty
6,287,893 B1    9/2001   Elenius et al.
6,326,698 B1   12/2001   Akram
6,342,726 B2 *  1/2002   Miyazaki et al. ........... 257/668
6,376,279 B1    4/2002   Kwon et al.
6,462,274 B1 * 10/2002   Shim et al. ................ 174/52.4

* cited by examiner

*Primary Examiner*—Evan Pert
*Assistant Examiner*—Luan Thai
(74) *Attorney, Agent, or Firm*—Birch, Stewart, Kolasch & Birch, LLP

(57) ABSTRACT

A semiconductor package and fabricating method are described, in which solder balls can be easily arrayed in a fan-out type arrangement and the package fabricating process is simplified. The semiconductor package includes a unit semiconductor chip and a first stress buffer layer contacting the unit semiconductor chip on two sides of the unit semiconductor chip. Bonding pads are separately arrayed on an upper part the unit semiconductor chip, and a second stress buffer layer formed on the first stress buffer layer and on the unit semiconductor chip, but not on an upper surface of each bonding pad. A plurality of conducting lines are formed on the second stress buffer layer, each conducting line contacting the upper surface of a respective bonding pad. A solder mask layer, which having a plurality of holes therein to expose at least one region of each conducting line, is formed over the conducting lines and the second stress buffer layer. A plurality of solder balls are then formed in the holes to contact the conducting lines.

18 Claims, 4 Drawing Sheets

SEMICONDUCTOR PACKAGE AND METHOD FOR FABRICATING THE SAME

This application is a divisional of co-pending application Ser. No. 09/723,246, filed on Nov. 28, 2000 now U.S. Pat. No. 6,486,005, the entire contents of which are hereby incorporated by reference and for which priority is claimed under 35 U.S.C. §120; and this application claims priority of Application No. P2000-17400 filed in Korea on Apr. 3, 2000 under 35 U.S.C. §119.

BACKGROUND OF THE INVENTION

1. Field of the Invention

The present invention relates to a semiconductor package, and more particularly to a semiconductor package and method for fabricating the same having a fan-out type chip size package (CSP) structure.

2. Background of the Related Art

In general, packaging technology for Integrated Circuits (ICs) has been developed to meet the needs for miniaturization and the reliability of packaging.

The need for miniaturization accelerates the development of a package close in size to a chip scale, and the need for the reliability of packaging encourages package fabricating technology which can improve efficiency of packaging and the mechanical and electrical reliability after packaging.

For a fan-in structure, solder balls are arrayed on the inner part of chip, which radiates heat. For a fan-out structure, solder balls are arrayed on the outer part of chip, to be projected, as well as the inner part of chip.

The related art semiconductor package will be described with reference to FIG. 1. As shown in FIG. 1, the related art semiconductor package includes a unit semiconductor chip 1 and two elastomers 2. The elastomers 2 are separated from each other on the upper part of the unit semiconductor chip 1 and extend to the exterior of both sides of the unit semiconductor chip 1.

A solder mask layer 3 is formed to be laid over the upper part of the separated elastomers 2, and a metal layer (not shown) is formed in one line direction along the surface of the elastomer 2 and the unit semiconductor chip 1. The solder mask layer 3 has a plurality of holes in the direction of a plurality of columns to expose the metal layer (not shown) on the upper part of the elastomer 2, and solder balls 4 are arranged in the holes to be in contact with the metal layer. In FIG. 1, three rows are on each side of the elastomers 2, each row consisting of four solder balls. The solder balls 4 in the outmost row are partially exposed to the outside of semiconductor chip 1 to form a fan-out structure.

In the above related art, an extra substrate such as the elastomer 2 is needed if the size of the semiconductor chip is reduced. Also, a capsule or supporter 5 is provided to enclose sides of the semiconductor chip 1, the elastomer 2 and the solder mask layer 3, thereby preventing the elastomer 2 from warping.

However, the related art semiconductor package has several problems. First, if the size of the chip 1 is changed, the extra substrate and the extra equipment for fabricating the same are needed to obtain the fan-out type chip scale package corresponding to the changed chip size. In addition, the thick capsule or supporter 5 is needed to prevent the substrate warpage. This complicates the package fabricating process.

SUMMARY OF THE INVENTION

Accordingly, the present invention is directed to a semiconductor package and fabricating method the same that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages, and in accordance with the purpose of the present invention as embodied and broadly described, a semiconductor package according to the present invention includes a unit semiconductor chip; a first stress buffer layer contacting the unit semiconductor chip on two sides of the unit semiconductor chip; at least one bonding pad arrayed on an upper part of the unit semiconductor chip; a second stress buffer layer formed over the first stress buffer layer and the unit semiconductor chip such that an upper surface of each bonding pad is exposed; at least one conducting line formed over the second stress buffer layer such that each conducting line contacts the upper surface of a respective bonding pad; a solder mask layer formed over the at least one conducting line and the second stress buffer layer, and having a plurality of holes therein to expose at least one region of each conducting line; and a plurality of solder balls formed in the holes to contact each conducting line.

In another aspect, a fabricating method of a semiconductor package includes forming bonding pads to be arrayed on different portions of a wafer defined by scribe lanes; attaching a first adhesive tape on the back of the wafer; dividing the wafer into a plurality of unit semiconductor chips, each chip containing at least one bonding pad, by cutting the scribe lanes; increasing a distance between the unit semiconductor chips by extending the first adhesive tape; forming a first stress buffer layer over the unit semiconductor chips; forming a second stress buffer layer over the first stress buffer layer and the unit semiconductor chips so as to expose an upper surface of each bonding pad; forming conducting lines over the second stress buffer respectively contacting the exposed upper surface of each bonding pad; forming a solder mask layer having a plurality of holes to expose at least one region of each conducting line; adhering solder balls in the holes to contact corresponding conducting lines; and forming unit semiconductor chip size packages by sequentially cutting the solder mask layer, the conducting lines, the second stress buffer layer, and the first stress buffer layer.

An advantage of the present invention is the provision of a semiconductor package and fabricating method for the same, in which solder balls are easily arranged in a fan-out type structure and the package fabricating process is simply performed.

It is to be understood that both the foregoing general description and the following detailed description are exemplary and explanatory and are intended to provide further explanation of the invention as claimed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
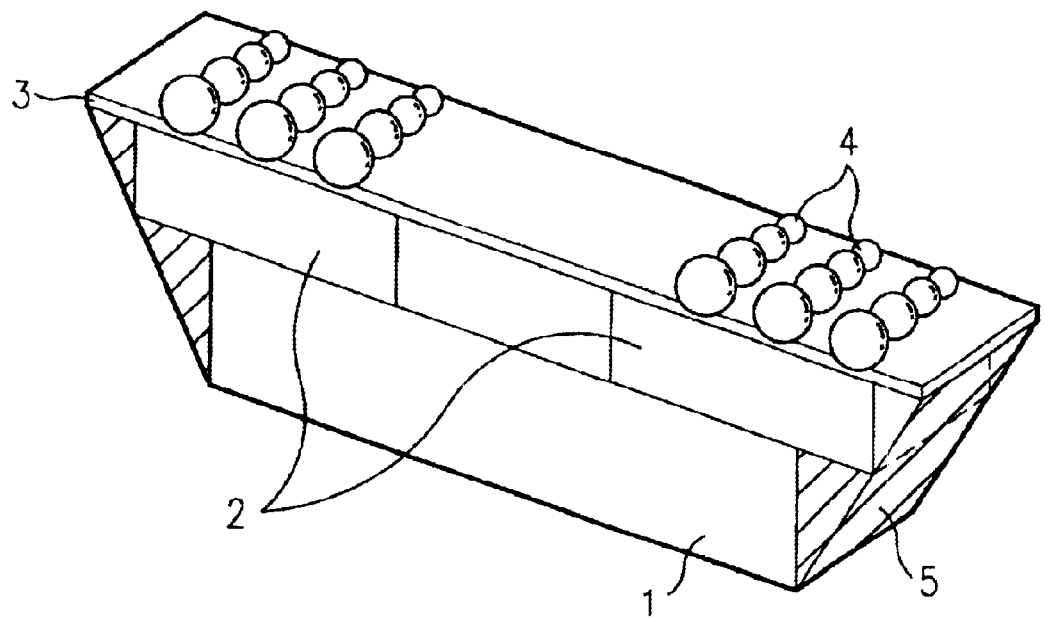
FIG. 1 is a perspective view showing the structure of the related art semiconductor package.

Reference will now be made in detail to the preferred embodiments of the present invention, examples of which are illustrated in the accompanying drawings. Where possible, the same reference numerals will be used to illustrate like elements throughout the specification.

In the present invention, it is intended that a fan-out type chip size package is efficiently fabricated at a level of wafer size and stress buffer layers are formed at sides of the chip to rearrange bonding pads.

Figure 2:
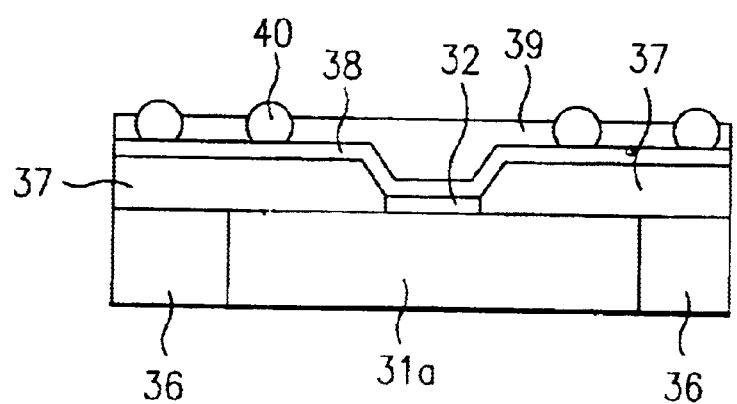
FIG. 2 illustrates the structure of a semiconductor package according to an embodiment of the present invention.

A unit semiconductor package according to the present invention will be described in detail with reference to FIG. 2. As shown in FIG. 2, a first stress buffer layer 36 is formed at both sides of a unit semiconductor chip 31a, and a plurality of bonding pads 32 are separately arrayed at the upper part of a center area of the unit semiconductor chip 31a in one linear direction.

A second stress buffer layer 37 is formed on the whole surface of the unit semiconductor chip 31a and the first stress buffer layer 36 so as to expose an upper surface of each bonding pad 32. A plurality of base metal layers 38 are formed on the second stress buffer layer 37 in a linear direction to be in contact with the upper surface of each bonding pad 32 respectively.

A solder mask layer 39 having a plurality of holes is formed to expose one region of each base metal layer 38. At this time, the holes are symmetrically formed at both sides of each bonding pad 32.

The outermost holes of the solder mask layer 39 are formed on the upper part of the outer area of the package. Alternatively, the holes of the solder mask layer extend from the upper part of the inner area of the package to the upper part of the outer area of the package (not shown).

Solder balls 40 are formed within each hole. The solder balls 40 are symmetrically formed at both sides of the bonding pads 32, the outermost solder balls 40 being formed on the outer area of the semiconductor chip in a fan-out structure.

Figure 3A:
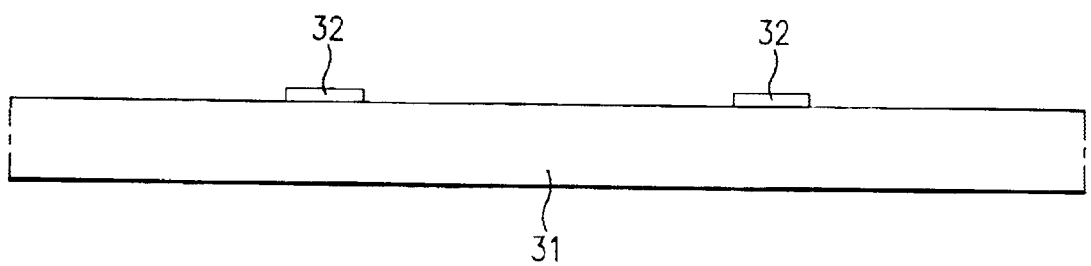
FIG. 3A to FIG. 3I are cross-sectional views of a fabricating method for a semiconductor package according to the embodiment of the present invention.

A fabricating method of the aforementioned semiconductor package will be described with reference to FIGS. 3A to 3I. As shown in FIG. 3A, the bonding pads 32 are formed on the upper part of the wafer 31. The bonding pads 32 are formed in a linear direction on the center area of unit semiconductor chips to be cut along the scribe lane during the sawing process.

Figure 3B:
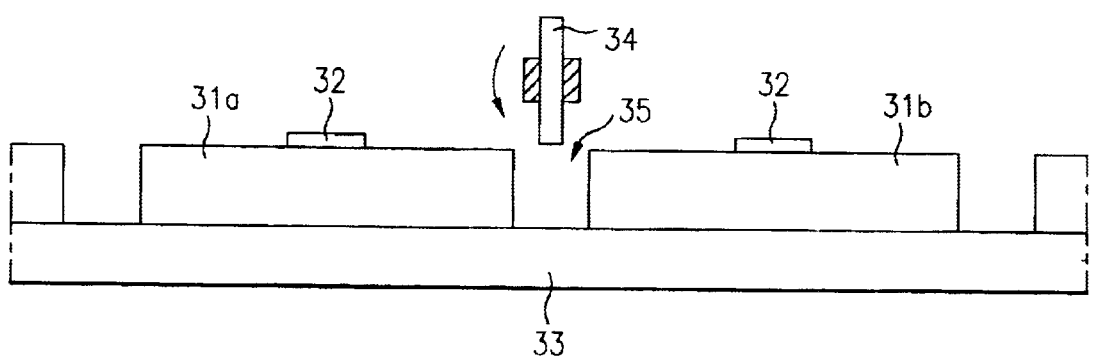

As shown in FIG. 3B, a first adhesive tape 33 of ultraviolet (UV) sensitive type is attached on the back of the wafer 31, and a first cutting section 35, that is, the scribe lane on the wafer 31 is then cut using a saw blade 34 to form unit semiconductor chips 31a and 31b.

Figure 3C:
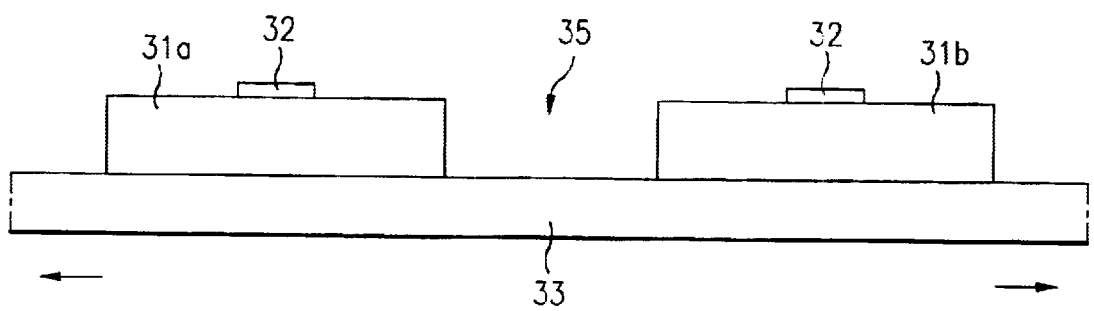

Then, as shown in FIG. 3C, the first adhesive tape 33 is expanded by pulling both ends. This makes the gap of the first cutting section 35 broaden as shown in the figure.

Figure 3D:
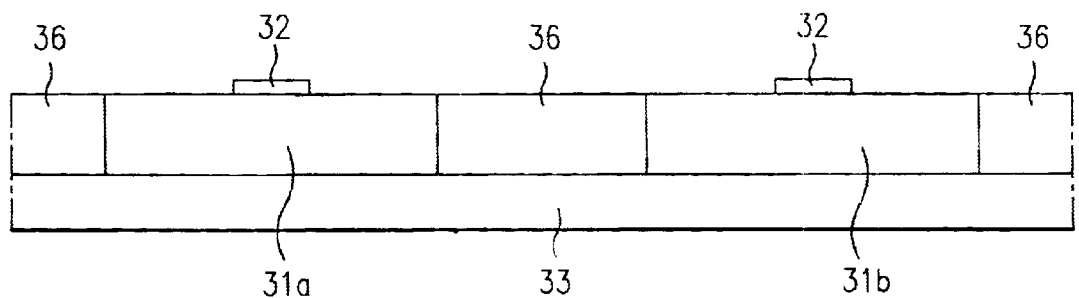

As shown in FIG. 3D, a first stress buffer layer 36 is deposited on the whole surface including the first cutting section 35. The first stress buffer layer 36 is then etched to remain in only the first cutting section 35 so that the semiconductor chips 31a and 31b are laterally supported. A material such as a silicon based benzocyclobutene (BCB), an oxide film or a nitride film is used as the first stress buffer layer 36, which acts as a buffer between chips and provides support.

Figure 3E:
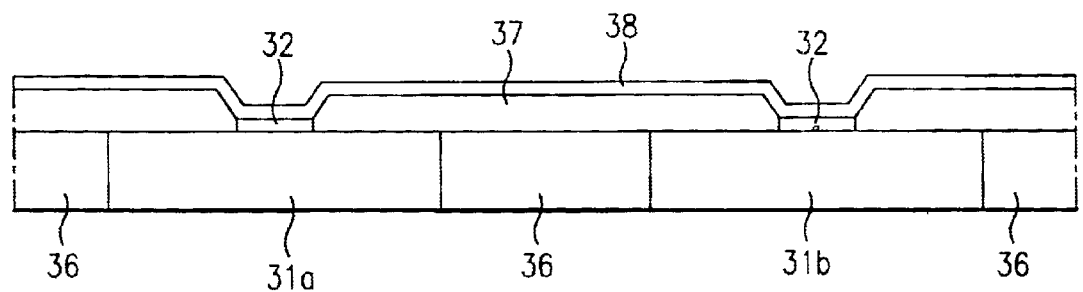

As shown in FIG. 3E, the first adhesive tape 33 is removed from the back of the wafer 31 and a second stress buffer layer 37 is coated on the whole surface. The second stress buffer layer 37 is then selectively etched to expose the bonding pads 32. Either photoresist or a silicon based BCB is used as the stress buffer layer 37. The photoresist acts as a mask while the silicon based BCB acts to reduce the difference of thermal expansion coefficients between solder balls and the unit semiconductor chips 31a and 31b. Then, a base metal layer 38 is deposited on the whole surface. The base metal layer 38 is then etched to define a plurality of conducting lines extending in a fan-out manner from the bonding pads 32.

Figure 3F:
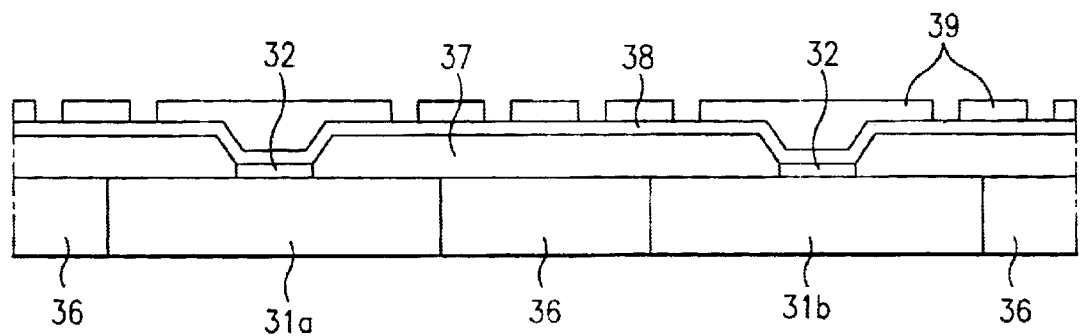

As shown in FIG. 3F, a solder mask layer 39 is deposited on the whole surface and the surface is flatted or planarized. Portions of the solder mask layer 39 corresponding to the later locations of the solder balls are selectively removed.

To form a fan-out type structure, the holes of the solder mask layer 39 are symmetrically formed at both sides of the bonding pads 32 of the semiconductor chips 31a and 31b. In FIG. 3F, while two holes are formed at both sides of the bonding pad as an example, two or more holes may be formed on both sides. The outermost holes are formed on the outer area of the unit semiconductor chips 31a and 31b or extending from the inner area of the semiconductor chip to beyond its outer area. The solder mask layer 39 is formed of an oxide film to protect the base metal layer 38 from the solder balls.

Figure 3G:
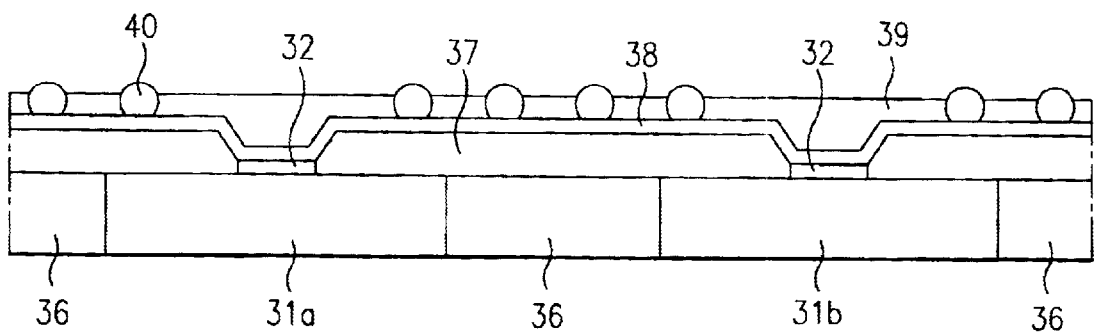

As shown in FIG. 3G, the solder balls 40 are mounted in the holes and adhered on the base metal layer 38 by reflow.

Figure 3H:
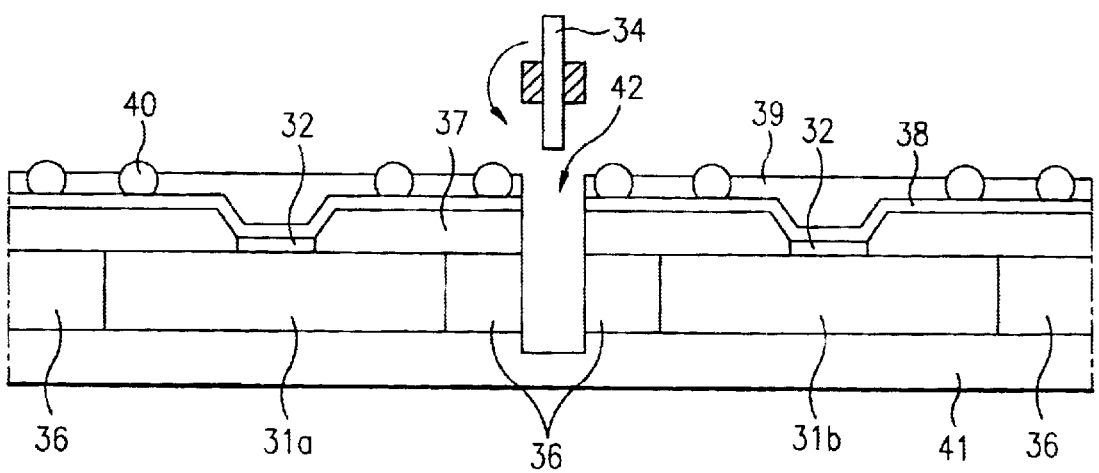

Then, as shown in FIG. 3H, a second adhesive tape 41 is attached to the back of the first stress buffer layer 36 and the semiconductor chips 31a and 31b to support the first stress buffer layer 36 and the semiconductor chips 31a and 31b. The solder mask layer 39, the base metal layer 38, the second and first stress buffer layers 37 and 36 are sequentially cut by the saw blade 34 at the second cutting section 42. At this time, the second cutting section 42 is located between the unit semiconductor chips 31a and 31b and defined in a region such that the first stress buffer layer 36 remains on both sides of the semiconductor chips 31a and 31b during the cutting process.

Figure 3I:
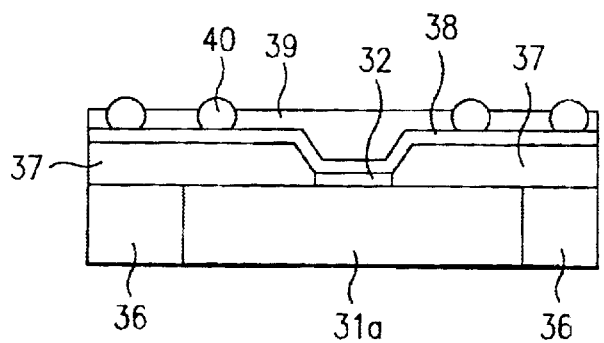

As shown FIG. 3I, the second adhesive tape 41 is removed. Thus, the process for the fan-out type chip size package is completed.

As has been explained, the semiconductor package and the fabricating method have the following advantages. First, even when the chip size is changed, it is possible to obtain the fan-out type chip size package corresponding to the changed chip size by the fabrication process. Secondly, because the first stress buffer layer supports the semiconductor chip at both sides of the semiconductor chip, an extra substrate is not needed to prevent the warpage of the semiconductor chip even if the chip size is reduced. This lowers the cost. Finally, since the chip sized package is provided, the time required for the package fabrication can be reduced.

It will be apparent to those skilled in the art that various modifications and variations can be made in the semiconductor package and the fabricating method the same according to the present invention without departing from the spirit or scope of the invention. Thus, it is intended that the present invention covers the modifications and variations of the invention provided they come within the scope of the appended claims and their equivalents.

What is claimed is:

1. A semiconductor package comprising:

a unit semiconductor chip;

a first stress buffer layer contacting the unit semiconductor chip on two sides of the unit semiconductor chip;

at least one bonding pad arrayed on an upper part of the unit semiconductor chip;

a second stress buffer layer former over the first stress buffer layer and the unit semiconductor chip such that an upper surface of each bonding pad is exposed;

at least one conducting line formed over the second stress buffer layer such that each conducting line contacts the upper surface of a respective bonding pad;

a solder mask layer formed continuously between opposite edges of the package and covering over the at least one conducting line and the second stress buffer layer, and having a plurality of holes therein to expose at least one region of each conducting line; and a plurality of solder balls formed in the holes to contact each conducting line.

2. The semiconductor package of claim 1, wherein the holes in the solder mask layer are symmetrically formed around the at least one bonding pad.

3. The semiconductor package of claim 1, wherein outermost holes among the holes of solder mask are formed on an outer area of the package.

4. The semiconductor package of claim 1, wherein the holes of solder mask layer extend from an outer area of the package.

5. The semiconductor package of claim 1, wherein a plurality of bonding pads are arrayed in a of the unit semiconductor chip in a line.

6. The semiconductor package of claim 5, wherein the at least one conducting line lies along a direction substantially perpendicular to the line of bonding pads.

7. A semiconductor package comprising:

a unit semiconductor chip;

a first stress buffer layer contacting the unit semiconductor chip on two sides of the unit semiconductor chip;

at least one bonding pad arrayed on an upper part of the unit semiconductor chip;

a second stress buffer layer extending from outer edges of the at least one bonding pad and over the first stress buffer layer and the unit semiconductor chip;

at least one conducting line formed over the second stress buffer layer such that each conducting line contacts the upper surface of a respective bonding pad;

a solder mask layer formed over the at least one conducting line and the second stress buffer layer, and having a plurality of holes therein to expose at least one region of each conducting line; and a plurality of solder balls formed in the holes to contact each conducting line.

8. The semiconductor package of claim 7, wherein the holes in the solder mask layer are symmetrically formed around the at least one bonding pad.

9. The semiconductor package of claim 7, wherein outermost holes among the holes of solder mask layer are formed on an outer area of the package.

10. The semiconductor package of claim 7, wherein the holes of solder mask layer extend from an inner area to an outer area of the package.

11. The semiconductor package of claim 7, wherein a plurality of bonding pads are arrayed in a center area of the unit semiconductor chip in a line.

12. The semiconductor package of claim 11, wherein the at least one conducting line lies along a direction substantially perpendicular to the line of bonding pads.

13. A semiconductor package comprising:

a unit semiconductor chip;

a first stress buffer layer contacting the unit semiconductor chip on two sides of the unit semiconductor chip, a thickness of the first stress buffer layer and a thickness of the unit semiconductor being substantially the same;

at least one bonding pad arrayed on an upper part of the unit semiconductor chip;

a second stress buffer layer formed over the first stress buffer layer and the unit semiconductor chip such that an upper surface of each bonding pad is exposed;

at least one conducting line formed over the second stress buffer layer such that each conducting line contacts the upper surface of a respective bonding pad;

a solder mask layer former over the at least one conducting line and the second stress buffer layer, and having a plurality of holes therein to expose at least one region of each conducting line; and a plurality of solder balls former in the holes to contact each conducting line.

14. The semiconductor package of claim 13, wherein the holes in the solder mask layer are symmetrically formed around the at least one bonding pad.

15. The semiconductor package of claim 13, wherein outermost holes among the holes of solder mask layer are formed on an outer area of the package.

16. The semiconductor package of claim 13, wherein the holes of solder mask layer extend from an inner area to an outer area of the package.

17. The semiconductor package of claim 13, wherein a plurality of bonding pads are arrayed in a center area of the unit semiconductor chip in a line.

18. The semiconductor package of claim 17, wherein the at least one conducting line lies along a direction substantially perpendicular to the line of bonding pads.

* * * * *